United States Patent [19]

Gjesdal

[11] Patent Number: 4,696,089
[45] Date of Patent: Sep. 29, 1987

[54] METHOD FOR APPLYING ELASTOMERIC SUPPORT PADS TO RIGID CASINGS

[75] Inventor: Harvey J. Gjesdal, Portland, Oreg.

[73] Assignee: Tektronix, Inc., Beaverton, Oreg.

[21] Appl. No.: 921,659

[22] Filed: Oct. 21, 1986

[51] Int. Cl.⁴ ............................................. B23P 11/02
[52] U.S. Cl. ......................................... 29/451; 29/235
[58] Field of Search ................ 29/451, 235, 428; 16/2

[56] References Cited

U.S. PATENT DOCUMENTS

| | | | |
|---|---|---|---|
| 2,119,520 | 6/1938 | Brokering | 29/428 UX |
| 2,457,930 | 1/1949 | Smith | 29/235 |
| 2,466,952 | 4/1949 | Jakubowski | 29/235 |
| 2,559,847 | 7/1951 | Brickman | 29/235 |
| 2,731,915 | 1/1956 | Garvey | 29/235 X |
| 2,996,796 | 8/1961 | Self | 29/235 |
| 3,090,115 | 5/1963 | Carr | 29/235 X |
| 3,221,456 | 12/1965 | Capel | 29/451 UX |
| 3,468,013 | 9/1969 | Sciamonte et al. | 29/451 |
| 3,914,844 | 10/1975 | Norwood | 29/451 X |
| 4,062,101 | 12/1977 | La Custa | 29/451 |

*Primary Examiner*—Charlie T. Moon
*Attorney, Agent, or Firm*—Robert L. Harrington

[57] ABSTRACT

A method of mounting support pads to rigid instrument casings, e.g. of metal or plastic. The pads are formed with flange portions designed to be force fit through a hole in the casing. The hole is provided with a key way or cutout. The corner that is formed at the juncture with the hole is outwardly angled and the opposite corner is inwardly angled. The flange of the pad is inserted under the outwardly angled corner and the pad is turned to wrap the flange around and under the hole edge.

4 Claims, 6 Drawing Figures

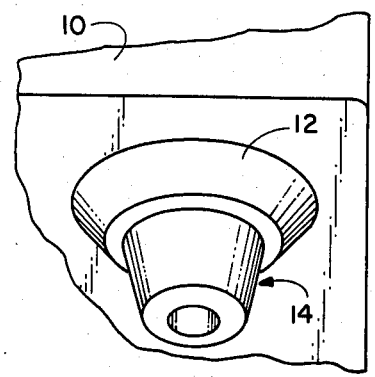
FIG. 1
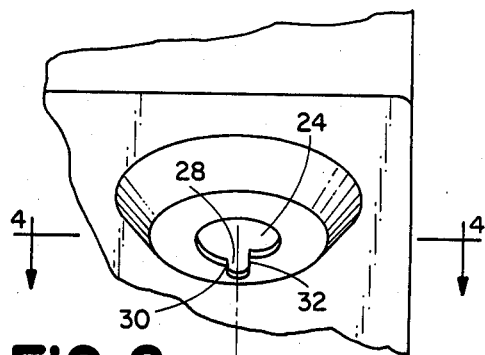
FIG. 2
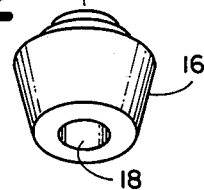
FIG. 6
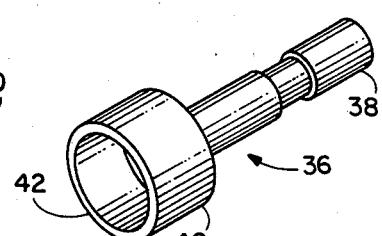
FIG. 3
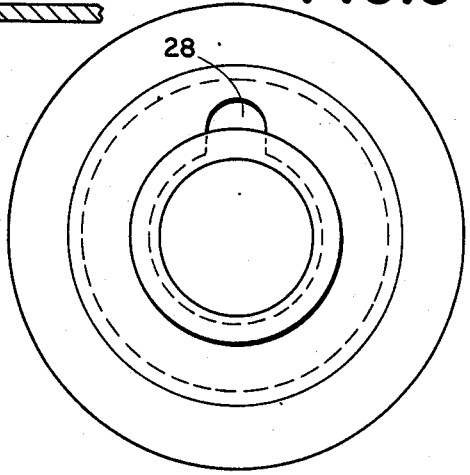
FIG. 4
FIG. 5

METHOD FOR APPLYING ELASTOMERIC SUPPORT PADS TO RIGID CASINGS

FIELD OF INVENTION

This invention relates to a system for applying support pads to metal or plastic casings, particularly accomplishing the task in a shorter time with less effort.

BACKGROUND OF THE INVENTION

This invention has particular application for electronic apparatus that requires the electronics to be shrouded in a rigid metal or plastic casing. A portable oscilloscope is an example of such an apparatus. The support pads on which the instrument rests, i.e. on a table or desk top, serve the purpose of preventing the instrument from sliding. Whereas metal and plastic easily slide on the typical desk top and table top surfaces, it is desirable to provide the instrument with elastomeric support pads that better grip the table top surface.

As the packaging of such instruments has become more efficient and thus less costly, attention is drawn to items such as the mounting of these elastomeric support pads to the metal or plastic casings. Typically the pads are provided by small frusto-conically shaped polyurethane pads having an end post of reduced dimension protruded from its base end. Surrounding the post and spaced from the pad by the thickness of the casing wall is a flange. The flange is slightly deformable by reason of its thickness and the elastomeric material.

Also, typically a hole is formed in the metal or plastic casing (at the position where the support is desired), the hole being large enough for the post but not the surrounding flange. The post is inserted from the outside into the hole until the flange is abutted against the casing wall. An assembler reaches into the casing (obviously before the electronics are added) with a plier or other prying tool and forces the flange portion through the hole. The pad then resists removal except with a similar reverse forcing of the pad (not a likely occurrence in the normal usage of an oscilloscope.) The assembler then cuts off the excess post material and the operation is completed.

This operation is understandably time consuming and somewhat fatiguing when it is done repeatedly by an assembler in a manufacturing operation.

SUMMARY OF THE INVENTION

In the present invention the hole through the metal casing is modified by providing a key way or cutout from the normal hole diameter. This cutout generates two corner portions at the interjection with the holes. One of the corners is angled outwardly relative to the other so that a portion of the flange of the elastomeric pad can be slid under that corner. Turning the pad while pushing it inwardly, warps the flange under the edge of the hole until the entire flange is on the opposite or inner side of the casing wall.

The pad can be applied manually without a prying tool, but more importantly, it can be totally applied from the outside with a power driver or hand driver. It is no longer necessary to add the pads prior to packaging the electronics within the casing, and the post portion that was provided for grabbing and pulling the flange through the hole is eliminated.

These and other advantages will be appreciated by reference to the following detailed description and to the drawings wherein:

FIG. 1 illustrates an instrument casing in partial prospective view with a support pad attached thereto;

FIG. 2 illustrates the same casing portion but with the support pad exploded away from the receiving hole in the casing;

FIG. 3 is an inside view illustrating the support pad being inserted in the receiving hole of the casing;

FIG. 4 is a section view taken on view lines 4—4 of FIG. 2.

FIG. 5 is an inside view similar to FIG. 3 but illustrating the support pad fully inserted in the receiving hole of the casing.

FIG. 6 is a tool for use in a power driver or hand driver, said tool being used for mounting the pads to the casing.

Referring first to FIG. 1 of the drawings, a metal or plastic casing 10 has a "landing" portion 12 extruded from the wall of the casing. An elastomeric pad 14, is mounted to the "landing" portion 12 of the casing as will be explained hereafter. The elastomeric pad 14 provides a support or foot for an instrument to be packaged in the casing 10. This pad is formed out of a polyurethane material to reduce slippage as when the instrument is placed on a desk top or the like.

The support pad 14 is best shown in FIGS. 2 and 4. The body portion 16 has a center cavity 18 (of no consequence herein), a flange portion 20 and an intermediate post portion 22. A hole 24 in the casing wall has a diameter that substantially matches the diameter of the post portion 22 of the pad. The length of the post substantially matches the thickness of the casing wall.

The flange portion 20 of the support pad is tapered as shown in FIG. 4 from a diameter of its outer end 25 that is substantially the same as the hole 24 and post 22, and expands to form a rim 26.

The purpose of the design features just described is to enable the tapered flange portion 20 to be forced through the hole 24, the elastomeric material allowing compression of the rim of the flange as it is forced through the hole. Once the flange portion is through the hole, it returns to its original shape with the rim 26 overlapping the hole edge to thereby resist removal. The much larger body portion 16 prevents further forcing of the pad through the hole 24.

The above described mounting operation is substantially the operation of inserting the pads through the holes of prior processes. However, in such prior processes, a post extension was protruded from the flange portion so that an assembler could grab the post and pull the pad through the hole, a far more successful procedure than trying to push the elastomeric pad through the hole. Of course the post extension was not required after insertion and it was generally desirable to cut it off as a final step in the operation.

The present invention provides a key way or cutout 28. The two sides of the cutout 28 form corners 30 and 32 with the edge of the hole. Corner 30 is angled out (or offset outwardly) and the corner 32 is angled in (or offset inwardly) as shown in FIGS. 2 and 4. FIG. 3, which is a view from inside the casing 10 illustrates the pad being applied to the casing. A portion of the flange 20, i.e. the rim, is inserted under the corner 30 and the pad is turned as indicated by the arrow. Corner 30 acts as a ramp to facilitate both insertion and turning of the flange portion. A small section 34 of the flange is compressed as the flange is wrapped under the casing wall until a full circle is completed. The compressed portion 34 reaches cutout 28 and pops through the hole, i.e. see FIG. 5 which is the same view after the pad is fully inserted.

The key way with offset corners is believed important to enable a smooth turning of the pad around the edge of the hole 24. It is not necessary for the flange 20 to be "threaded" as long as the flange is compressible. With the turning action, the rim 26 of the flange grips the underside of the casing and pulls itself through the hole.

Whereas the pad 14 can be inserted manually in the manner described above, it is desirable to use a power driver to effect the mounting operation. A tool 36 for use in such a power or hand driver is illustrated in FIG. 6. The tool 36 includes a shaft 38 that is adapted to fit the chuck of the driver. A cup 40 is provided with a tapered inside wall 42, that fits the body portion 16 of the pad. The driver rotates the tool 36, and the cup 40 grips and rotates the elastomeric pad 14. As described above, inserting the rim 26 of the flange under the corner 30 will readily and easily accomplish mounting of the pad to the casing.

Others having knowledge of this concept of mounting an elastomeric pad to a metal or plastic casing will conceive of variations and modifications. Such are contemplated and encompassed by the appended claims hereto.

I claim:

1. A method for mounting elastomeric support pads to a rigid casing comprising:

providing an elastomeric support pad having a body portion, a flange portion and an intermediate post portion, providing a hole in a rigid casing wall, the wall having a thickness substantially the length of the post portion and the hole having a diameter substantially the diameter of the post portion, providing said flange portion of the support pad with a rim diameter greater than the hole diameter which is at least partially compressible, and the improvement which comprises:

providing a cutout in the casing wall from the edge of the hole, said cutout and intersecting hole edge forming an outwardly angled corner, said cutout and outwardly angled corner providing a lead-in ramp for the flange portion of the pad, and inserting a portion of the rim of the flange under the corner and thereby inside the casing, and turning the pad to force a continuation of the rim of the flange under the hole edge while compressing a small section of the flange until that compressed section is positioned at the cutout whereat the full flange portion is inserted inside the casing wall.

2. A method as defined in claim 1 wherein the cutout and intersecting hole edge forms an opposed corner that is inwardly angled to facilitate insertion and sliding of the rim of the flange as the flange is turned under the outwardly angled corner.

3. A method as defined in claim 2 wherein the flange portion is tapered from a diameter at its free end substantially the diameter of the casing hole, thereby assisting in insertion of the flange through the hole.

4. A method as defined in claim 3 wherein the pad mounting process is adaptable for power driving apparatus to automatically insert the pads through the hole in the casing.

* * * * *